XR  3,962,062

United States Patent
Ingrey

[11] 3,962,062
[45] June 8, 1976

[54] SPUTTERED DIELECTRIC THIN FILMS

[75] Inventor: Sidney Ivor Joseph Ingrey, Aylmer East, Canada

[73] Assignee: Northern Electric Company Limited, Montreal, Canada

[22] Filed: Dec. 9, 1974

[21] Appl. No.: 530,849

[52] U.S. Cl. ............................. 204/192; 204/298; 317/258; 350/96 WG; 350/164; 350/311
[51] Int. Cl.² .................... C23C 15/00; G02B 5/14; G02B 5/28; H01G 4/08
[58] Field of Search ........................... 204/192, 298

[56] References Cited
UNITED STATES PATENTS

| 3,558,461 | 1/1971 | Parisi ................................ 204/192 |
| 3,607,384 | 9/1971 | Banks ............................ 204/192 X |
| 3,607,697 | 9/1971 | Shirn et al. ....................... 204/192 |

OTHER PUBLICATIONS

W. D. Westwood, "Analysis of an Ar-$O_2$-$N_2$ Discharge for Tantalum Sputtering," J. Voc. Sci. Tech. vol. 11, No. 1, pp. 175-178, Jan./Feb. (1974).

Chem. Abstr. vol. 81, 55153e (1974).

M. Croset et al., "Study of Competitive Diffusion at 525°C of $N_2$ and $O_2$ in Sputtered B-Ta Films," J. Voc. Sci. Tech., vol. 19, No. 1, pp. 165-168 (1972).

Primary Examiner—T. Tung
Assistant Examiner—Aaron Weisstuch
Attorney, Agent, or Firm—Sidney T. Jelly

[57] ABSTRACT

Sputtered thin films, particularly of tantalum and niobium, are prepared having predetermined optical and dielectric properties by controlling the flow rate of $O_2$ in relation to the flow rate of $N_2$. By controllably varying the ratio, differing characteristics can be obtained. Thus a stepwise or a continuous variation in refractive index can be obtained. Films show low optical losses and birefringent properties, and are particularly suitable for optical waveguides, capacitors and filters.

10 Claims, 4 Drawing Figures

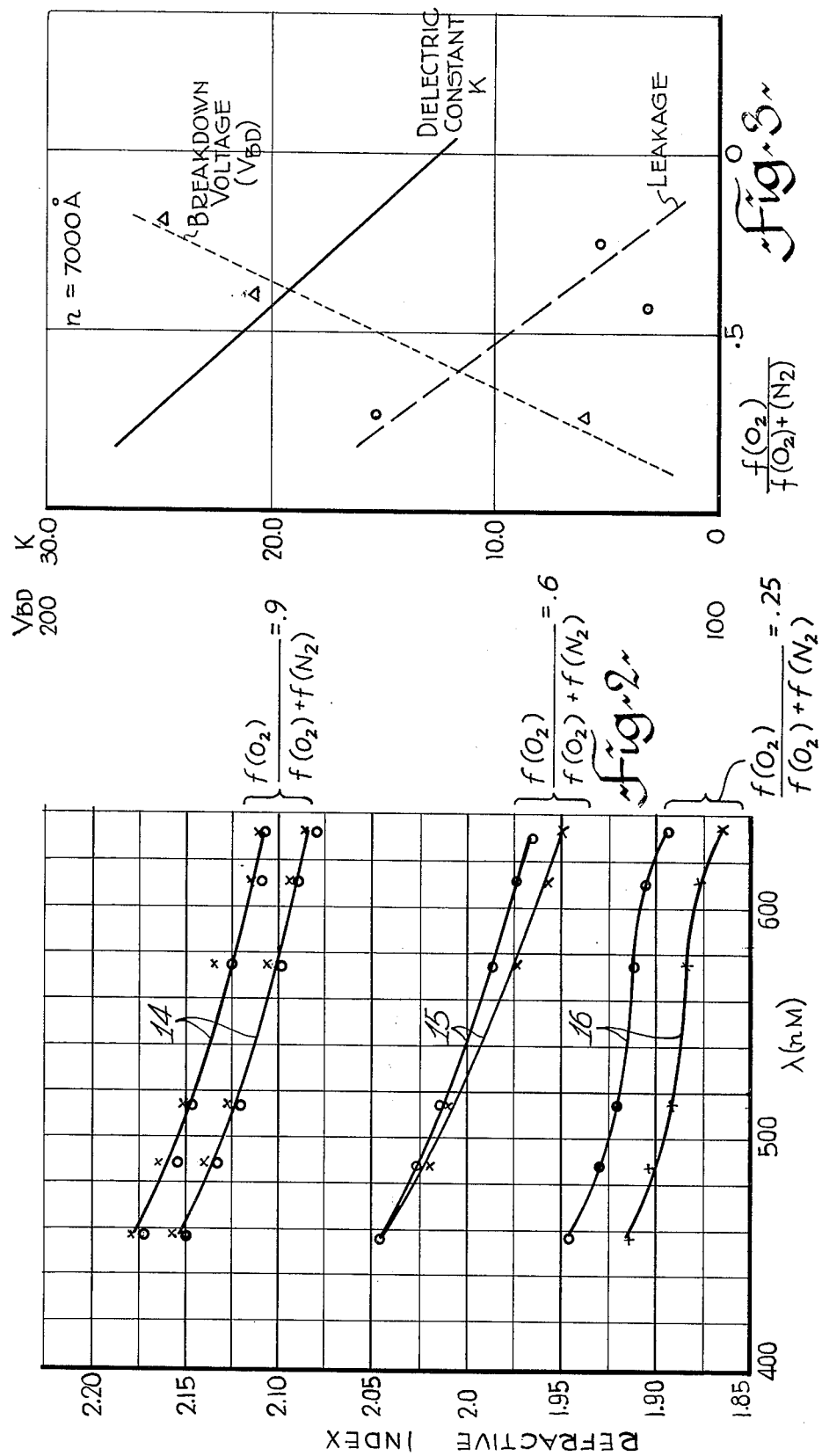

SPUTTERED DIELECTRIC THIN FILMS

This invention is concerned with sputtered dielectric thin films, and in particular with the preparation of such films by the sputtering of tantalum or niobium in an oxygen/nitrogen atmosphere, or in atmospheres of oxygen/nitrogen and one or more inert gases.

The present invention provides sputtered films having predetermined optical and dielectric properties. Thus the refractive index can be predetermined, and it is also possible to provide films having a stepwise variation or a continuous variation in the refractive index. Broadly, the films are deposited by sputtering while controllably varying the ratio of the flow rate of $O_2$ in relation to the flow rate of $N_2$, conveniently referred to as $$\frac{f(O_2)}{f(O_2)+f(N_2)}.$$

Films deposited have shown low optical losses and birefringent properties. The films are particularly suitable for optical waveguides, capacitors and filters.

The invention will be readily understood by the following description of various embodiments, in conjunction with the accompanying drawings, in which:

FIG. 2 illustrates dispersion curves of three films prepared with different flow rate ratios;

FIG. 3 illustrates the relationship between measured dielectric properties and the flows rate ratio for Ta;

Taking as a specific example the sputtering of tantalum in oxygen/nitrogen mixtures, the optical and dielectric properties can be closely controlled by variation of the $$\frac{f(O_2)}{f(O_2)+f(N_2)}$$

gas ratio of the reactive gases in the sputtering system. By suitable control of this ratio, films with specifically chosen optical and dielectric properties can be fabricated.

Figure 1:
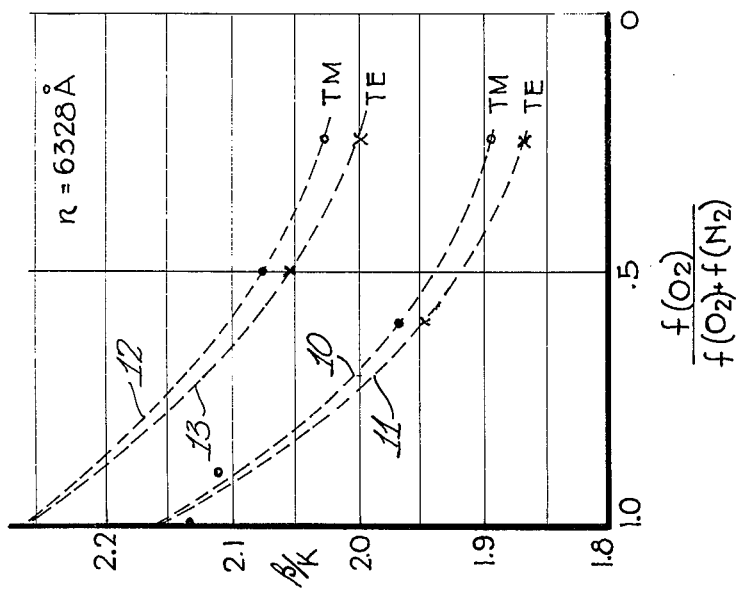
FIG. 1 illustrates the variation in effective refractive index (B/K) of films as a function of the flow rate ratio of the reactive gases in the sputtering system, for tantalum (Ta) and niobium (Nb)

FIG. 1 illustrates the variation in the effective refractive indexes (B/K) of a series of films at a wavelength of 6328A deposited onto glass substrates with variation in the ratio of $$\frac{f(O_2)}{f(O_2)+f(N_2)}$$

for Ta — curves 10 and 11 — and Nb — curves 12 and 13. Two curves, 10 and 11 on 12 and 13 are observed for each material, and this is due to an increasing birefringence as the flow rate ratio decreases. $f(O_2)$ and $f(N_2)$ are the flow rates of the reactive gases.

Thus, as illustrated in FIG. 1, for Ta, the effective refractive index varies from approximately 2.1 to approximately 1.9 as the $$\frac{f(O_2)}{f(O_2)+f(N_2)}$$

ratio decreases from about 1.0 to about 0.25; illustrated by the curves 10 and 11. As illustrated by curves 12 and 13 the variation in effective refractive index for Nb is from approximately 2.3 to 2.0 as the $$\frac{f(O_2)}{f(O_2)+f(N_2)}$$

ratio decreases from about 1.0 to about 0.25.

As is indicated by the double curves 10 and 11 and double curves 12 and 13, the films exhibit birefringent properties.

It is possible to deposit a film of a particular refractive index by adjusting the gas ratio to that necessary to give the index required. It is possible to deposit a number of films sequentially, each having a diffcrent refractive index, by adjusting the gas ratio at predetermined periods. Alternatively it is possible to deposit a film having a continuously variable refractive index by continuously varying the gas ratio during sputtering.

The dispersion curves i.e. refractive index versus wavelength λ, of three Ta films prepared with different oxygen to nitrogen ratios are illustrated in FIG. 2 at 14, 15 and 16. The dispersion curves for Nb are similar.

The losses in the films are generally below 1 dB for the $TE_0$ mode when the films are deposited on a low loss substrate, for example, Corning 7059 glass. Grading the refractive index normal to the plane of the film can be used to reduce interface losses by restraining the light beam in a particular region in the wave guide. This grading of the index is readily carried out during formation of the films by variation of the oxygen/nitrogen ratio with the gas flow controls.

This grading is particularly applicable to high loss substrates. Thus for example, the loss for the $TE_0$ mode in a homogenous wave guide on soda-glass (a high loss substrate) is approximately 9 dB/cm, whereas for a linearly graded index wave guide, the index ranging from approximately 2.2 to 1.9, the loss is approximately 3.5 dB/cm.

Because of the low actual losses and the ease with which they can be prepared, the films are applicable to the fabrication of electroptic devices, such as frequency filters and directional couplers. The birefringent property of the sputtered films in accordance with the present invention makes the films particularly suitable for use in interference filters.

Basically, there are two types of interference filters. In the first type, a transparent substrate has a series of transparent films or layers successively deposited on one surface, the films or layers having alternating high and low refractive indices. The second type has a birefringent substrate onto which are deposited a series of films or layers as for the above described first type. The basic substrate for the second type of filter is generally of either mica or calcite, birefringence normally only occurring in single crystals. The preparation of mica or calcite substrates is a slow and expensive process as they have to be polished accurately to a particular thickness, determined by the desired characteristics. A typical example of such a filter is one generally referred to as a Lyot filter. Birefringence is essential for such a filter and was provided only by the use of single crystals.

By the use of the present invention, the mica or calcite can be replaced by glass on which can be deposited a birefringent film. The expensive birefringent substrate is thus dispensed with and the film thickness can be easily controlled during deposition to give the desired birefringent effect.

Thus in a filter of the above referred Lyot type, the single crystal is replaced by a glass substrate having a birefringent layer on one surface of the substrate. As a contradistinction to the previously provided filters, where birefringence is obtained with single crystal substrates, with the present invention birefringence is obtained with an amorphous structure.

Sputtered films in accordance with the present invention also exhibit very good qualities as capacitors. FIG. 3 illustrates the relationships between dielectric properties and the oxygen-nitrogen ratio for Ta. Again similar relationships occur for Nb. The films have a high dielectric constant, high breakdown voltage and low leakage current density characteristics and are thus very suitable for capacitors. Furthermore, the characteristics can be controlled by controlling the oxygen/nitrogen ratio of the ambient during sputtering. The following table gives figures showing the relationship between dielectric properties and the oxygen/nitrogen ratio on tantalum substrates.

| $f(O_2)/(f(O_2)+f(N_2))$ | nF | Dissipation | leakage $J_L(A.\ cm^{-2})$ | VBD | K |
|---|---|---|---|---|---|
| .25 | 1.457 | .002 | $2.8 \times 10^{-9}$ | 185 | 16.5 |
| .25 | 1.45 | .0017 | $2.0 \times 10^{-9}$ | 180 | 16.4 |
| .45 | 1.66 | .002 | $1.3 \times 10^{-9}$ | 165 | 20 |
| .71 | 2.26 | .004 | $7 \times 10^{-9}$ | 120 | 25 |

Figure 4:
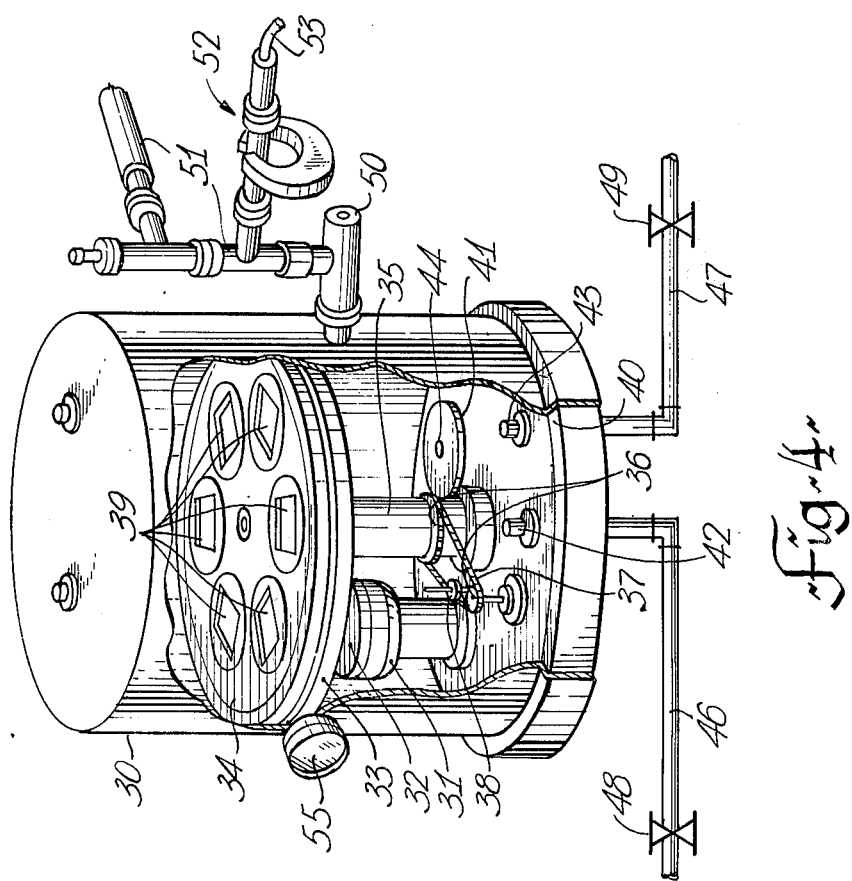
FIG. 4 is a diagrammatic drawing of one form of sputtering apparatus useful in the practice of the invention.

Thickness of Films 7100A
where nF=capacitance
VBD=Breakdown voltage
K=dielectric constant FIG. 4 illustrates one form of apparatus, by way of example, typical of conventional sputtering systems. It comprises a sealable housing 30, a support and shield 31 for the sputtering electrode cathode 32, a rotatable anode 33 and a rotatable substrate holder 34. The anode 33 has an aperture therein which is positioned over the cathode 32 by rotation of support 35 via gears 36 and a toothed belt 37. An idler 38 maintains tension in the belt 37.

The support 35 is hollow and a supporting shaft for the substrate holder 34 extends up through support 35. Substrate holder 34 has a series of apertures 39 for reception of substrates. The apertures 39 can be positioned over the aperture in the anode 33 and thus over the cathode 32 by rotation of its support shaft by a motor (not shown) beneath the base 40 of the apparatus.

In the base 40 is a vacuum pump outlet 41 and also gas inlets 42 and 43. The outlet 41 comprises an aperture covered by a hinged flap. The flap has a small aperture 44 therein. In the arrangement illustrated in FIG. 4, one of the inlets will be used for oxygen and the other for nitrogen. Thus, for example oxygen is supplied to inlet 42 and nitrogen is supplied to inlet 43. The oxygen and nitrogen supplies are indicated diagrammatically by pipes 46 and 47 respectively. An oxygen flow control valve is indicated at 48 and a nitrogen flow control valve is indicated at 49.

A sputtering operation is started by first reducing the pressure in the chamber, the flap of the pump outlet 41 being hinged upward to provide full-bore access. Once the predetermined pressure has been obtained in the chamber the flap is closed down, the suction pump then only exhausting through the small aperture 44. This reduces the gas flow volume through the chamber. The supply of gases are regulated to the inlets 42 and 43 by the valves 48 and 49.

In the example illustrated, a small flow of gases is also exhausted from the chamber 30 via the outlet 50, a vacuum pump being connected to the pipe line 51. The small flow provides a sampling flow of gas for a mass spectrometer 52. The pressure in the chamber is pumped down to 20mTorr for example, while the pressure at the mass spectrometer 52 is approximately $5 \times 10^{-5}$ Torr. Adjustment of gas flows are made as necessary. The output from the mass spectrometer is used to monitor the oxygen/nitrogen ratio in the atmosphere of the chamber 30, the output being fed via cable 53. An alternative method of monitoring the ambient in the chamber 30 is by an optical monochromator. Continuous monitoring of the ambient is not necessary as the calibration of the control valves can be accurate enough to obtain the desired flow variations without monitoring.

Sputtering is first started with a blank substrate positioned over the cathode 32. After sputtering has been stabilized, the turntable is rotated and the first productive substrate positioned over the cathode 32. After the desired time period the turntable is rotated to position the next substrate over the cathode 32. Typical values for sputtering voltage and current density are 3KV and 0.55mA/sq.cm.

The cathode is of the material to be sputtered. Thus for the examples described above, the cathode is of tantalum or niobium. If a film having a particular property, for example a desired refraction index or a desired dielectric property, is required, the ratio of oxygen flow to nitrogen flow, is set from calibration curves, similar to FIGS. 1, 2 and 3, to give the predetermined desired value. If a variable characteristic is desired, for example if a film having a refractive index varying continuously from the substrate to the outer surface of the film, the gas flow ratio is varied in accordance with predetermined variation obtained from calibration curves. The refraction index can be varied from a lower value at the substrate surface to the outer surface of the film, or the reverse, as desired. The variation can be linear or non-linear.

If a stepwise variation in property is required the gas flow ratio is varied, stepwise, at predetermined intervals of time by predetermined amounts. Again the direction of variation is optional, increasing or decreasing from the substrate surface. The variation can be equal or non-equal, the film being composed of a plurality of thin layers of differing properties. Optical and dielectric properties of other forms can be provided.

What is claimed is:

1. A method of sputtering a thin dielectric film containing one of tantalum and niobium in a gaseous atmosphere consisting of nitrogen and oxygen, comprising:
    positioning a substrate on a holder in a sealable chamber;
    positioning a cathode in said chamber, said cathode made of material to be sputtered;
    evacuating the chamber to a predetermined high vacuum;

feeding oxygen and nitrogen into the chamber, and maintaining a flow of said gases through the chamber;

adjusting the flow of said gases to give a predetermined pressure in the chamber;

varying the flows of said gases as necessary to give a predetermined ratio of said gases in the chamber;

moving said substrate into sputtering position relative to said cathode;

sputtering a thin dielectric film on said substrate.

2. A method of sputtering a thin dielectric film containing one of tantalum and niobium, in an atmosphere consisting of nitrogen and oxygen, comprising:

positioning a substrate on a holder in a chamber;

positioning a cathode in said chamber, said cathode made of material to be sputtered;

evacuating said chamber to a predetermined high vacuum;

feeding oxygen and nitrogen gases separately into said chamber and adjusting the flows to give a predetermined pressure;

adjusting the relative flows of oxygen and nitrogen to give a predetermined ratio of said gases in said chamber;

sputtering a thin film on said substrate;

varying the relative flows of oxygen and nitrogen as necessary to give a predetermined variation in gas ratio in said chamber during sputtering to vary the ratio of oxygen to nitrogen included in said film.

3. A method as claimed in claim 2 including continuously carrying the relative flows of oxygen and nitrogen in a predetermined manner during sputtering to continuously vary the ratio of oxygen to nitrogen included in said film.

4. A method as claimed in claim 2 including varying the relative flows of oxygen and nitrogen at predetermined time intervals by predetermined amounts during sputtering.

5. A method of sputtering a thin dielectric film containing one of tantalum and niobium, in an atmosphere consisting of nitrogen and oxygen, said film having predetermined optical properties, comprising positioning a substrate in a chamber, and providing a cathode composed of said one of tantalum and niobium;

evacuating said chamber to a predetermined vacuum;

feeding oxygen and nitrogen gases separately into said chamber;

adjusting the flows of oxygen and nitrogen to give a predetermined pressure in said chamber and varying the relative flows to give a predetermined ratio of said gases in the chamber;

and sputtering a thin film containing said one of tantalum and niobium on said substrate to form a thin film having a predetermined ratio of oxygen to nitrogen included in said film to give said predetermined optical property.

6. A method as claimed in claim 5 including varying the relative flows of oxygen and nitrogen during sputtering to produce a predetermined variation in the ratio of oxygen and nitrogen and to form a thin film having a predetermined variable optical property.

7. A method as claimed in claim 5 including varying the relative flows of oxygen and nitrogen in a stepwise manner at a predetermined time intervals and by predetermined amounts, during sputtering, and forming a thin film composed of a series of thin layers, each layer having a predetermined ratio of oxygen and nitrogen included therein to produce an optical property which varies in a predetermined manner from the preceding layer.

8. A method of sputtering a thin dielectric film containing one of tantalum and niobium, in an atmosphere consisting of nitrogen and oxygen, said film having predetermined dielectric properties comprising:

positioning a substrate in a chamber and providing a cathode composed of one of tantalum and niobium;

evacuating said chamber to a predetermined vacuum;

feeding oxygen and nitrogen gases separately into said chamber;

adjusting the flows of oxygen and nitrogen to give a predetermined pressure in said chamber and varying the relative flows to give a predetermined ratio of said gases in the chamber; and sputtering a thin film containing said one of tantalum and niobium on said substrate to form a thin film having a predetermined ratio of oxygen to nitrogen included therein to give predetermined dielectric property.

9. A method as claimed in claim 8 including varying the relative flows of oxygen and nitrogen during sputtering to produce a predetermined variation in the ratio of oxygen and nitrogen in said film and to form a thin film having a predetermined variable dielectric property.

10. A method as claimed in claim 8 including varying the relative flows of oxygen and nitrogen in a stepwise manner at predetermined time intervals and by predetermined amounts, during sputtering, and forming a thin film composed of a series of thin layers, each layer having a predetermined ratio of oxygen to nitrogen included therein to give a dielectric property which varies in a predetermined manner from the oxygen to nitrogen ratio and dielectric property of the preceding layer.

* * * * *